US012791582B2

(12) United States Patent
Li et al.

(10) Patent No.: US 12,791,582 B2
(45) Date of Patent: Nov. 10, 2026

(54) TEST ELEMENT GROUP AND USING THE SAME

(71) Applicant: NANYA TECHNOLOGY CORPORATION, New Taipei City (TW)

(72) Inventors: Wei Zhong Li, New Taipei City (TW); Da-En Chien, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 220 days.

(21) Appl. No.: 18/668,243

(22) Filed: May 20, 2024

(65) Prior Publication Data

US 2025/0355021 A1 Nov. 20, 2025

(51) Int. Cl.
*G01R 1/073* (2006.01)
*G01R 31/26* (2020.01)

(52) U.S. Cl.
CPC ..... *G01R 1/07342* (2013.01); *G01R 31/2601* (2013.01)

(58) Field of Classification Search
CPC ........................ G01R 1/07342; G01R 31/2601
See application file for complete search history.

(56) References Cited

U.S. PATENT DOCUMENTS

2007/0075718 A1* 4/2007 Hess ..................... H10P 74/277 324/762.05
2011/0050273 A1* 3/2011 Ma ................. G01R 31/318511 324/762.05
2015/0287655 A1* 10/2015 Killingsworth .... G01R 31/2884 438/15

FOREIGN PATENT DOCUMENTS

TW 202318681 A 5/2023

* cited by examiner

*Primary Examiner* — Rishi R Patel
*Assistant Examiner* — Suresh K Rajaputra
(74) *Attorney, Agent, or Firm* — CKC & Partners Co., LLC

(57) ABSTRACT

Provided is a test element group located at a scribe line of a wafer, including a first probe pad, at least one second probe pad, at least one third probe pad, at least one upper row contacting region, and at least one lower row contacting region. When the at least one upper row contacting region is electrically connected to the first probe pad, the at least one second probe pad, and the at least one third probe pad, the at least one lower row contacting region is insulated from the first probe pad, the at least one second probe pad, and the at least one third probe pad, vice versa. Thus, the original metal routing of double row TEGs are kept, but the contact is landed to one row of TEG's probe pad.

15 Claims, 6 Drawing Sheets

TEST ELEMENT GROUP AND USING THE SAME

BACKGROUND

Field of Invention

The present invention relates to a test element group and using the same.

Description of Related Art

Integrated circuit chips have been widely used in today's electronic products. As technology advances, the width and spacing within the metal wiring layers that provide equipotential contacts in integrated circuits are getting smaller and smaller, allowing wafers to have denser semiconductor components. In order to provide more chips on the wafer, scribe line reduction is one of the methods. However, test element group (TEG) needs to occupy a certain area in the scribe line, so that the size of the scribe line is difficult to reduce.

Therefore, how to provide the test element group in a reduced scribe line, the related art really needs to be improved.

SUMMARY

The present disclosure provides a test element group located at a scribe line of a wafer, the test element group comprises a first probe pad, at least one second probe pad, at least one third probe pad, at least one upper row contacting region, and at least one lower row contacting region. The first probe pad, the at least one second probe pad, and the at least one third probe pad are sequentially aligned. The at least one upper row contacting region is located between the at least one second probe pad and the at least one third probe pad. The at least one lower row contacting region is opposite to the at least one upper row contacting region, the at least one lower row contacting region is located between the at least one second probe pad and the at least one third probe pad. When the at least one upper row contacting region is electrically connected to the first probe pad, the at least one second probe pad, and the at least one third probe pad, the at least one lower row contacting region is insulated from the first probe pad, the at least one second probe pad, and the at least one third probe pad; or when the at least one lower row contacting region is electrically connected to the first probe pad, the at least one second probe pad, and the at least one third probe pad, the at least one upper row contacting region is insulated from the first probe pad, the at least one second probe pad, and the at least one third probe pad.

In some embodiments, the at least one upper row contacting region comprises three of a plurality of vias corresponding to the first probe pad, the at least one second probe pad, and the at least one third probe pad, respectively.

In some embodiments, when the at least one upper row contacting region is electrically connected to the first probe pad, the at least one second probe pad, and the at least one third probe pad, the three of the plurality of vias electrically connected to the first probe pad, the at least one second probe pad, and the at least one third probe pad, respectively.

In some embodiments, the at least one lower row contacting region comprises three of a plurality of vias corresponding to the first probe pad, the at least one second probe pad, and the at least one third probe pad, respectively.

In some embodiments, when the at least one lower row contacting region is electrically connected to the first probe pad, the at least one second probe pad, and the at least one third probe pad, the three of the plurality of vias electrically connected to the first probe pad, the at least one second probe pad, and the at least one third probe pad, respectively.

In some embodiments, a number of the at least one second probe pad is two second probe pads; a number of the at least one third probe pad is two third probe pads; each one of the two second probe pads and each one of the two third probe pads are arranged interactively in sequence.

In some embodiments, a number of the at least one upper row contacting region is three upper row contacting regions; and a number of the at least one lower row contacting region is three lower row contacting regions; wherein each one of the three upper row contacting regions is located between adjacent one of the two second probe pads and adjacent one of the two third probe pads, wherein each one of the three lower row contacting regions is located between adjacent one of the two second probe pads and adjacent one of the two third probe pads.

In some embodiments, the first probe pad is a gate probe pad, the at least one second probe pad is at least one drain probe pad, and the at least one third probe pad is at least one source probe pad.

In some embodiments, a width of the test element group is less than or equal to a width of scribe line being from 50 μm to 60 μm.

In some embodiments, the test element group further comprises a substrate, a plurality of metal layers, a top layer, and a plurality of vias. The plurality of metal layers are over the substrate. The top layer is over the plurality of metal layers, and the top layer comprises the first probe pad, the at least one second probe pad, and the at least one third probe pad. The plurality of vias are connected to at least one of the plurality of metal layers. The at least one upper row contacting region comprises three of the plurality of vias corresponding to the first probe pad, the at least one second probe pad, and the at least one third probe pad, respectively.

In some embodiments, the at least one lower row contacting region comprises three of the plurality of vias corresponding to the first probe pad, the at least one second probe pad, and the at least one third probe pad, respectively.

In some embodiments, the plurality of metal layers comprises an active layer and a gate electrode layer over the active layer; the wafer further comprises an insulating layer disposed between the active layer and the gate electrode layer.

The present disclosure also provides a method of using a test element group, comprising:

In some embodiments, providing the test element group as above mentioned; providing a first photomask to form three of a plurality of vias in the at least one upper row contacting region and the three of the plurality of vias electrically connected to the first probe pad, the at least one second probe pad, and the at least one third probe pad, respectively; and detecting an upper chip through contacting the three of the plurality of vias in the at least one upper row contacting region, the first probe pad, the at least one second probe pad, and the at least one third probe pad by a test device.

In some embodiments, the method further comprises providing a second photomask to seal the three of the plurality of vias in the at least one upper row contacting region, and to form three of a plurality of vias in the at least one lower row contacting region and the three of the plurality of vias electrically connected to the first probe pad, the at least one second probe pad, and the at least one third probe pad, respectively; and detecting a lower chip through contacting the three of the plurality of vias in the at least one lower row contacting region, the first probe pad, the at least one second probe pad, and the at least one third probe pad by the test device.

In some embodiments, the first probe pad is a gate probe pad, the at least one second probe pad is at least one drain probe pad, and the at least one third probe pad is at least one source probe pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The disclosure can be more fully understood by reading the following detailed description of the embodiment, with reference made to the accompanying drawings as follows.

DETAILED DESCRIPTION

Figure 1:
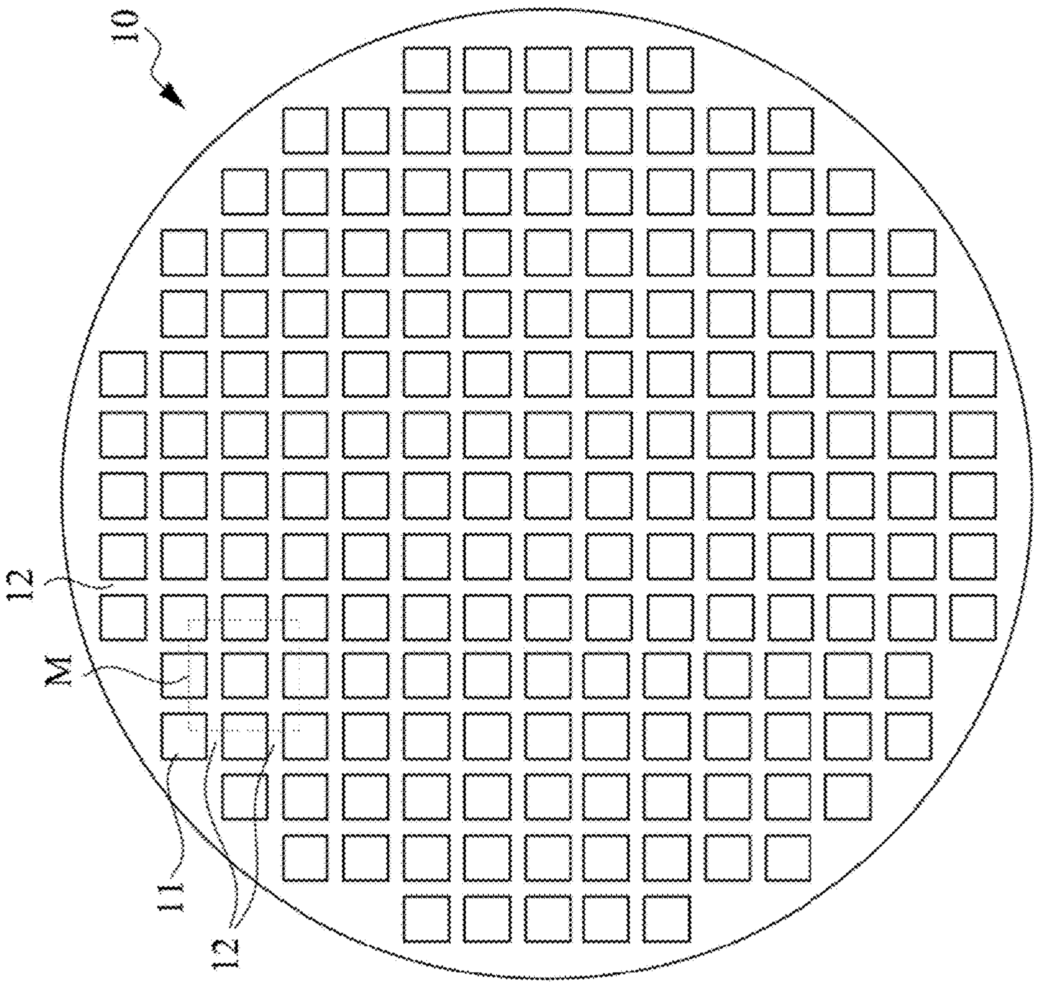
FIG. 1 is a plane view of a wafer containing test element groups according to some embodiments of the present disclosure.

The following disclosure provides detailed description of many different embodiments, or examples, for implementing different features of the provided subject matter. These are, of course, merely examples and are not intended to limit the invention but to illustrate it. In addition, various embodiments disclosed below may combine or substitute one embodiment with another, and may have additional embodiments in addition to those described below in a beneficial way without further description or explanation. In the following description, many specific details are set forth to provide a more thorough understanding of the present disclosure. It will be apparent, however, to those skilled in the art, that the present disclosure may be practiced without these specific details.

Further, spatially relative terms, such as "beneath," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. Still further, the present disclosure may repeat reference numerals and/or letters in the various examples. This repetition is for the purpose of simplicity and clarity and does not in itself dictate a relationship between the various embodiments and/or configurations discussed.

The scribe line width reduction is generally in future technology node, which have benefit for more gross dies on the wafer. That is, another meaning of "increasing gross die" in continuing Moore's law. However, when scribe line width shrinkage, impact to the object size on the scribe line such as kerf mark, test element group (TEG) or test key, film thickness measurement slam. The major challenge is double row TEGs which often used in MOSFET collection because the probe pad is not able to shrink and will be over to scribe line region and touch to chip area when scribe line shrinkage.

The present disclosure keeps all model MOSFET TEG's contacting regions location as original double row and with single row probe pad for the reduction of the scribe line width. Therefore, the original metal routing of double row TEGs are kept, but the contact is landed to one row of TEG's probe pad.

A number of examples are provided herein to elaborate the test element group and using the same of the instant disclosure. However, the examples are for demonstration purpose alone, and the instant disclosure is not limited thereto.

Please refer to FIG. 1, FIG. 1 is a plane view of a wafer containing test element groups according to some embodiments of the present disclosure. A wafer 10 includes a plurality of chips 11 and a plurality of scribe lines 12. The wafer 10 includes a semiconductor material including, but not limited to silicon wafer, a group III_V wafer, a silicon-on-insulator (SOI) wafer, a silicon-on-sapphire (SOS) wafer, and/or another material wafer.

A variety of circuit devices may be mounted in the plurality of chips 11. For example, a resistor, an inductor, a capacitor, a diode, a transistor, etc. may be mounted in the plurality of chips 11. The chips 11 includes, but is not limited to may be rectangular, e.g. may be square. The chips 11 may extend to various edges of the wafer 10, and partial chips may be defined. A number of chips 11 may be more than, the same as, or less than that illustrated in FIG. 1.

The plurality of scribe lines 12 is defined as a region between the chip 11 on the wafer 10 and another chip 11. The scribe lines 12 may be or correspond to a region cut to separate the plurality of chips 11 after processing of the wafer 10 is finished.

Figure 2:
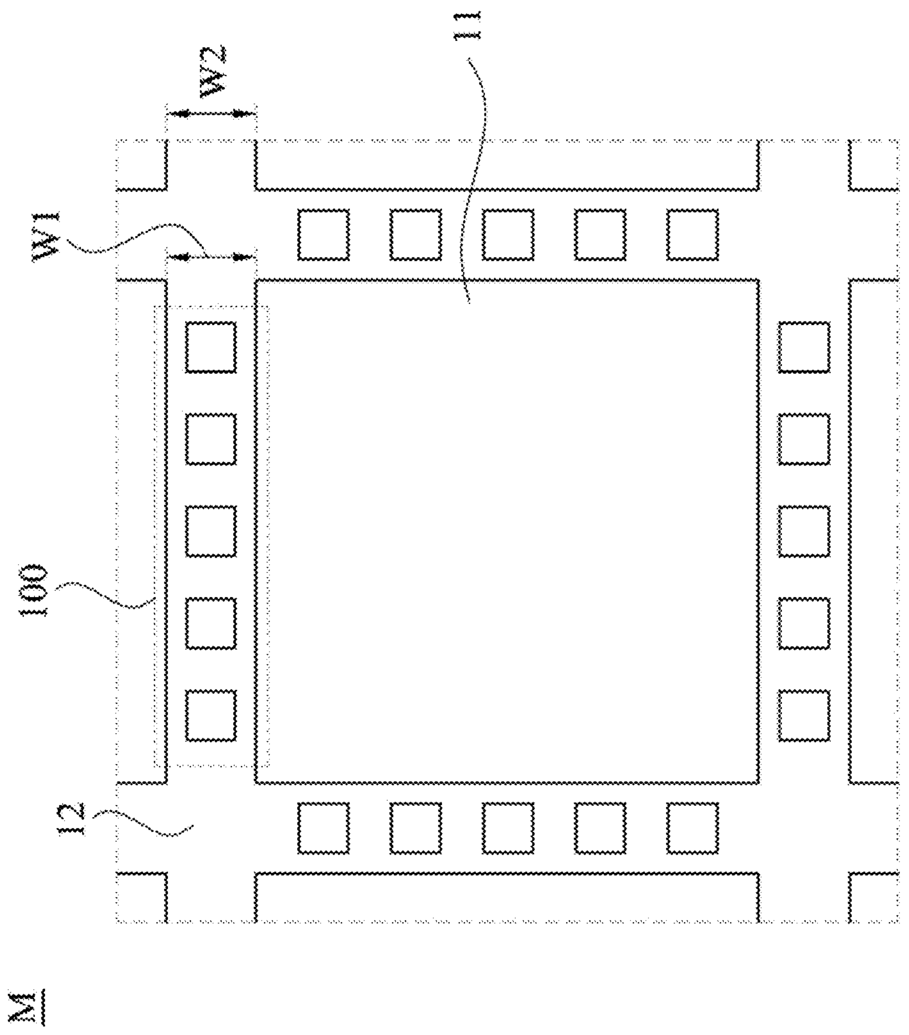
FIG. 2 is a enlarge view M of FIG. 1.

Please refer to FIGS. 1 and 2, FIG. 2 is a enlarge view M of FIG. 1. A test element group 100 may include a pattern implemented to measure actual characteristics of a semiconductor chip. When the test element group 100 is mounted on the scribe line 12, the test element group 100 may be disposed adjacent to at least two chips 11 on the wafer 10. A width W1 of the test element group 100 is less than or equal to a width W2 of scribe line 12 being from 50 μm to 60 μm. In some examples, the width W2 of one of the plurality of scribe lines 12 is less than 70 μm, less than 60 μm, or less than 50 μm.

Figure 3:
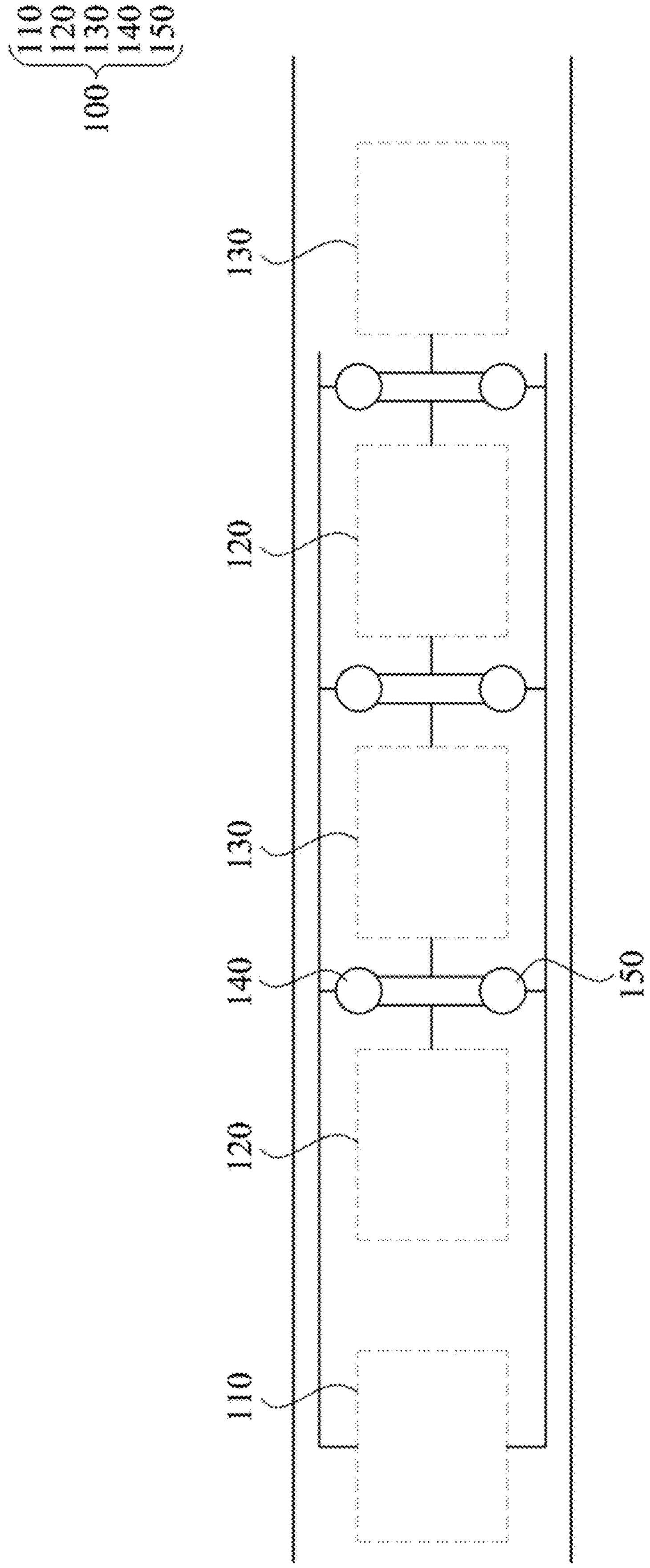
FIG. 3 is a enlarge view of FIG. 2.

Please refer to FIG. 3, FIG. 3 is a enlarge view of FIG. 2. The test element group 100 comprises a first probe pad 110, at least one second probe pad 120, at least one third probe pad 130, at least one upper row contacting region 140, and at least one lower row contacting region 150. The first probe pad 110, the at least one second probe pad 120, and the at least one third probe pad 130 are sequentially aligned. In some examples, the first probe pad 110 is a gate probe pad, the at least one second probe pad 120 is at least one drain probe pad, and the at least one third probe pad 130 is at least one source probe pad.

In some examples, a number of the at least one second probe pad 120 is two second probe pads 120; a number of the at least one third probe pad 130 is two third probe pads 130; each one of the two second probe pads 120 and each one of the two third probe pads 130 are arranged interactively in sequence. In some examples, a number of the at least one upper row contacting region 140 is three upper row contacting regions 140; and a number of the at least one lower row contacting region 150 is three lower row contacting regions 150. Each one of the three upper row contacting regions 140 is located between adjacent one of the two second probe pads 120 and adjacent one of the two third probe pads 130, and each one of the three lower row contacting regions 150 is located between adjacent one of the two second probe pads 120 and adjacent one of the two third probe pads 130.

Figure 4:
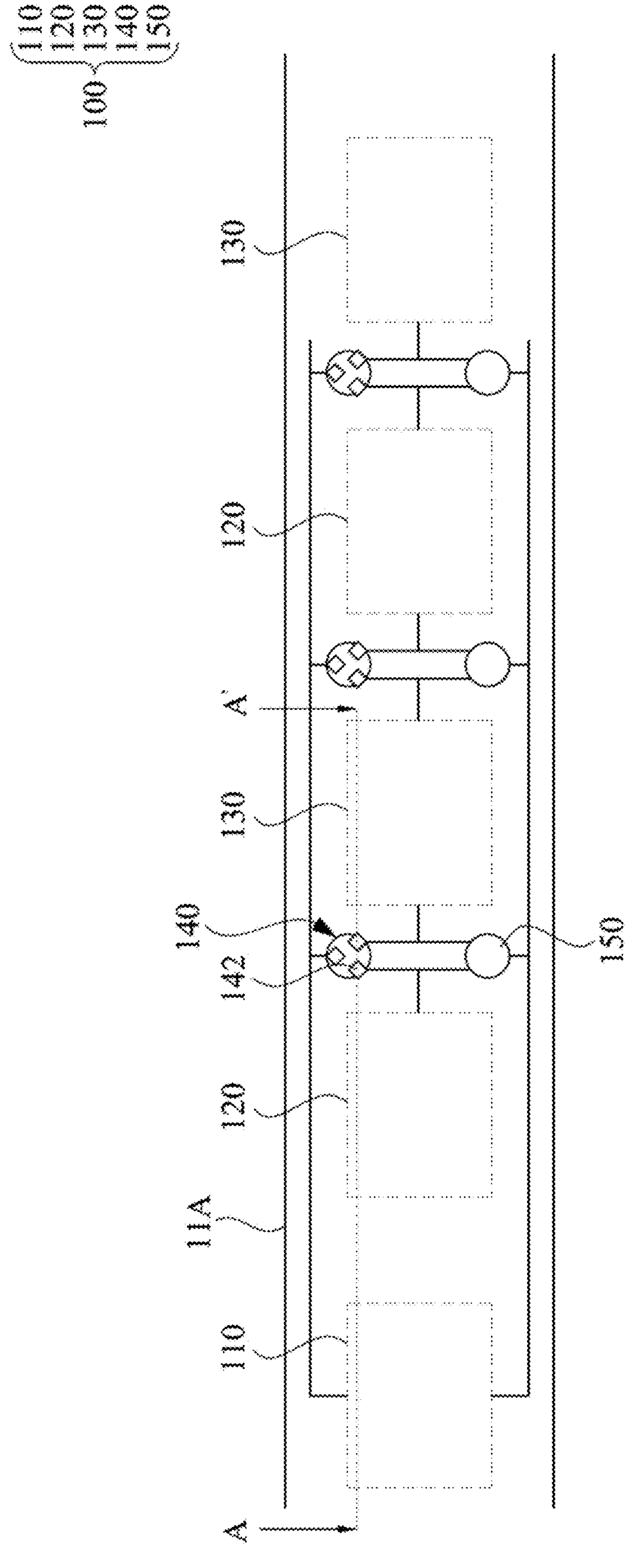
FIG. 4 is a schematic view of testing an upper chip by electrically connecting an upper row contacting region according to some embodiments of the present disclosure.

Please refer to FIG. 4, FIG. 4 is a schematic view of testing an upper chip 11A by electrically connecting the upper row contacting region 140 according to some embodiments of the present disclosure. The at least one upper row contacting region 140 is located between the at least one second probe pad 120 and the at least one third probe pad 130. In some examples, the at least one upper row contacting region 140 comprises three vias 142 corresponding to the first probe pad 110, the at least one second probe pad 120, and the at least one third probe pad 130, respectively. In some examples, when the at least one upper row contacting region 140 is electrically connected to the first probe pad 110, the at least one second probe pad 120, and the at least one third probe pad 130, the three vias 142 electrically connected to the first probe pad 110, the at least one second probe pad 120, and the at least one third probe pad 130, respectively. And then, the at least one lower row contacting region 150 is insulated from the first probe pad 110, the at least one second probe pad 120, and the at least one third probe pad 130.

Figure 5:
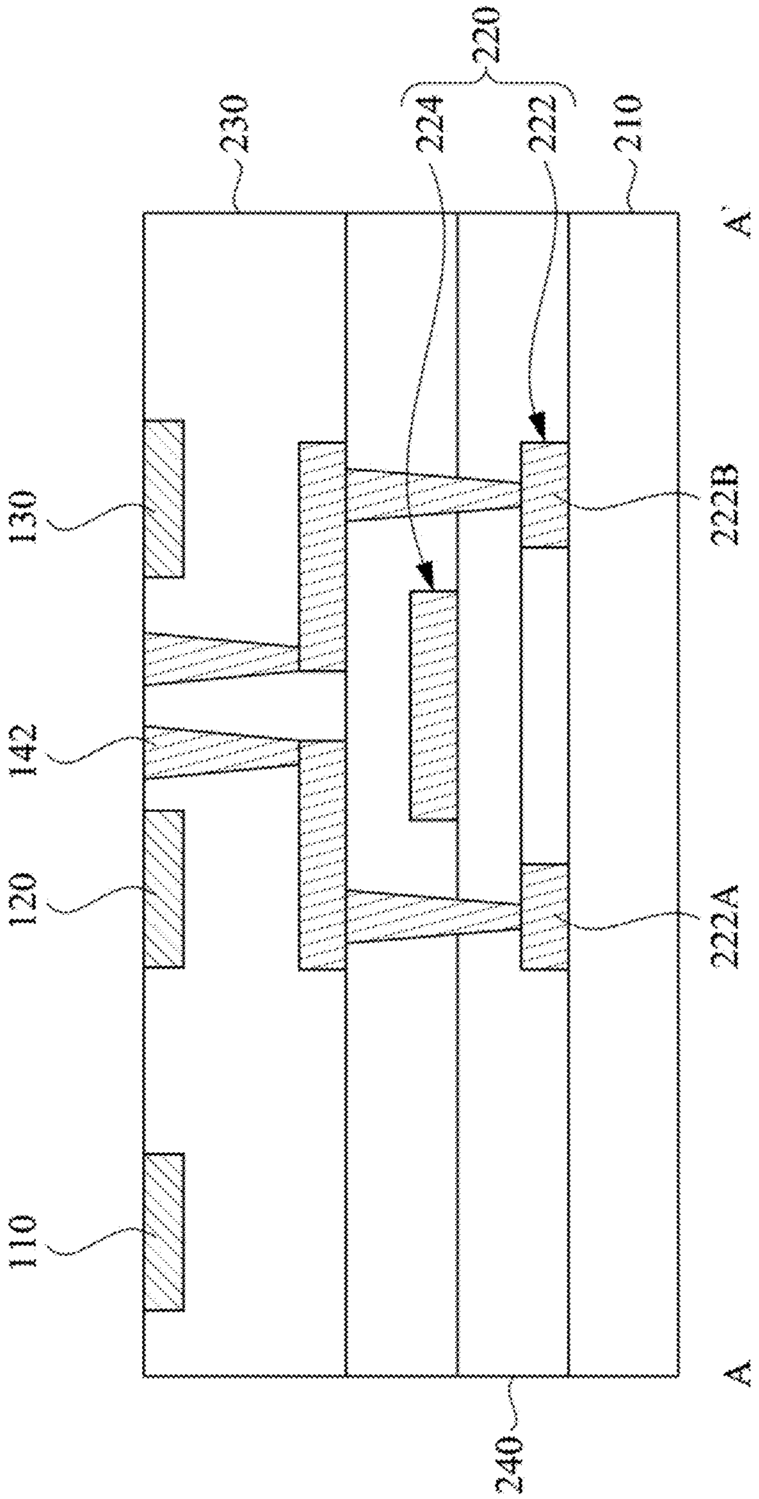
FIG. 5 is a cross-sectional view in line AA' of FIG. 4.
Figure 6:
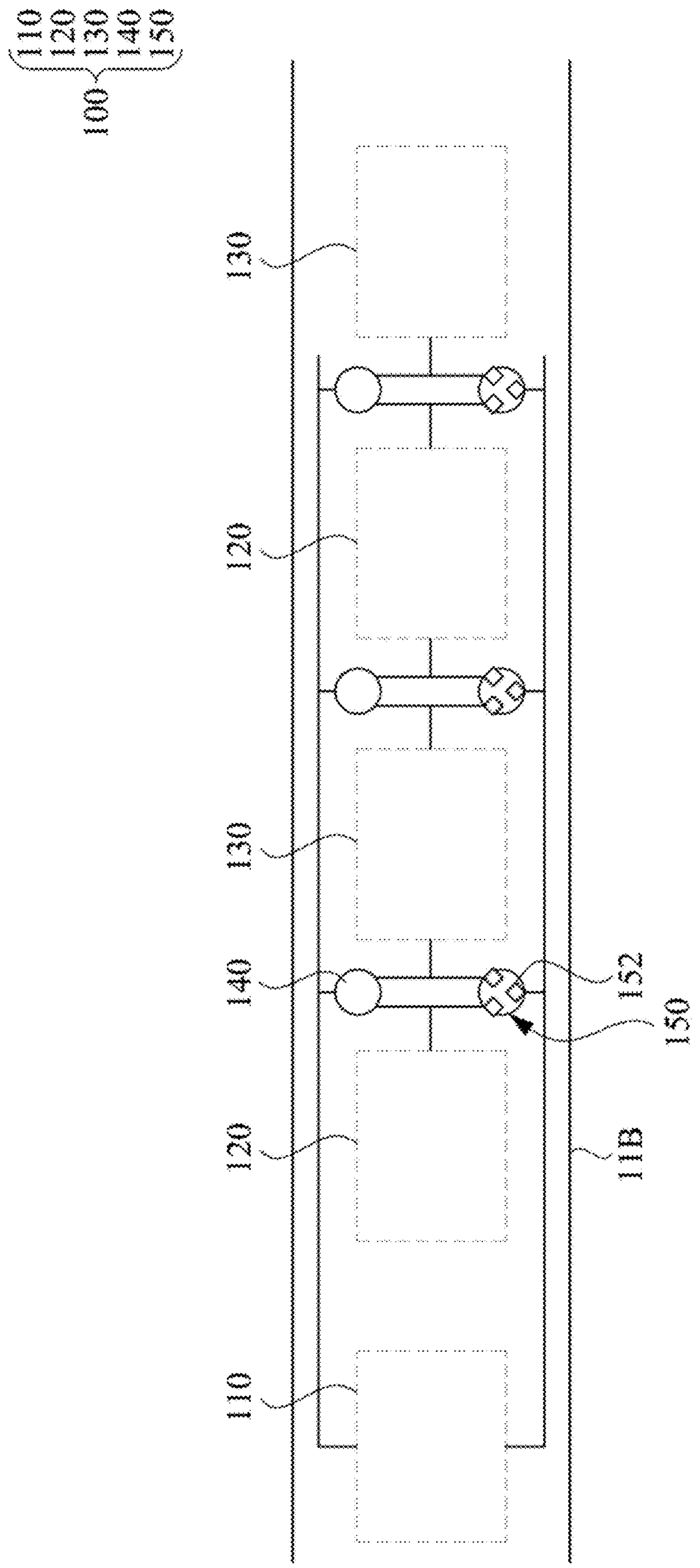
FIG. 6 is a schematic view of testing a lower chip by electrically connecting a lower row contacting region according to some embodiments of the present disclosure.

Please refer to FIGS. 4 and 5, FIG. 5 is a cross-sectional view in line AA' of FIG. 4. FIG. 5 is an example, the metal routing can be any routing that has been used and is not limited to FIG. 5. The test element group 100 further comprises a substrate 210, a plurality of metal layers 220, a top layer 230, and the plurality of vias 142. The plurality of metal layers 220 are over the substrate 210. The top layer 230 is over the plurality of metal layers 220, and the top layer 230 comprises the first probe pad 110, the at least one second probe pad 120, and the at least one third probe pad 130. The plurality of vias 142 (or vias 152 as shown in FIG. 6) connected to at least one of the plurality of metal layers 220. In some examples, the at least one upper row contacting region 140 comprises three of the plurality of vias 142 corresponding to the first probe pad 110, the at least one second probe pad 120, and the at least one third probe pad 130, respectively. In some examples, the at least one lower row contacting region 150 comprises three of the plurality of vias 152 corresponding to the first probe pad 110, the at least one second probe pad 120, and the at least one third probe pad 130, respectively. In some examples, the plurality of metal layers 220 include, but are not limited to two layers, three layers, four layers, five layers, six layers, or seven layers, and the vias directly or indirectly connected to which layer depend on the testing need.

In some examples, the plurality of metal layers 220 comprises an active layer 222 and a gate electrode layer 224 over the active layer 222. The wafer 10 further comprises an insulating layer 240 disposed between the active layer 222 and the gate electrode layer 224. In some examples, the active layer 222 includes a source 222A and a drain 222B, the at least one second probe pad 120 electrically connected to the source 222A through one of the plurality of vias 142, and the at least one third probe pad 130 electrically connected to the drain 222B through another one of the plurality of vias 142.

Please refer to FIG. 6, FIG. 6 is a schematic view of testing a lower chip 11B by electrically connecting the lower row contacting region 150 according to some embodiments of the present disclosure. The at least one lower row contacting region 150 is opposite to the at least one upper row contacting region 140, and the at least one lower row contacting region 150 is located between the at least one second probe pad 120 and the at least one third probe pad 130. In some examples, the at least one lower row contacting region 150 comprises three vias 152 corresponding to the first probe pad 110, the at least one second probe pad 120, and the at least one third probe pad 130, respectively. In some examples, when the at least one lower row contacting region 150 is electrically connected to the first probe pad 110, the at least one second probe pad 120, and the at least one third probe pad 130, the three vias 152 electrically connected to the first probe pad 110, the at least one second probe pad 120, and the at least one third probe pad 130, respectively. And then, the at least one upper row contacting region 140 is insulated from the first probe pad 110, the at least one second probe pad 120, and the at least one third probe pad 130.

Although a series of operations or steps are used below to describe the method disclosed herein, an order of these operations or steps should not be construed as a limitation to the present invention. For example, some operations or steps may be performed in a different order and/or other steps may be performed at the same time. In addition, all shown operations, steps and/or features are not required to be executed to implement an embodiment of the present invention. In addition, each operation or step described herein may include a plurality of sub-steps or actions.

Please refer back to FIG. 4, the present disclosure provides a method of using the test element group, comprising providing the test element group 100 as above mentioned; providing a first photomask to form three of the plurality of vias 142 in the at least one upper row contacting region 140 and the three of the plurality of vias 142 electrically connected to the first probe pad 110, the at least one second probe pad 120, and the at least one third probe pad 130, respectively; and detecting an upper chip 11A through contacting the three of the plurality of vias 142 in the at least one upper row contacting region 140, the first probe pad 110, the at least one second probe pad 120, and the at least one third probe pad 130 by a test device. In some examples, the test device includes, but is not limited to a probe card. The original metal routing of double row TEG is kept, but the contact is landed to one row of TEG's probe pad. Therefore, if need to measure other row of TEG's contacting region, no need to tape-out all layer mask and just change contact location to other row of TEG's contacting region because the corresponding metal routing is well-prepared.

Please refer back to FIG. 6, the present disclosure provides the method of using the test element group 100 further comprising providing a second photomask to seal the three of the plurality of vias 142 in the at least one upper row contacting region 140 (as shown in FIG. 4), and to form three of the plurality of vias 152 in the at least one lower row contacting region 150 and the three of the plurality of vias 152 electrically connected to the first probe pad 110, the at least one second probe pad 120, and the at least one third probe pad 130, respectively; and detecting a lower chip 11B through contacting the three of the plurality of vias 152 in the at least one lower row contacting region 150, the first probe pad 110, the at least one second probe pad 120, and the at least one third probe pad 130 by the test device. By keep double row TEG's contacting regions with metal routing to both row TEGs, it is optional to measure the different rows of TEGs which is able to save lots of mask and room of scribe line, that is make scribe line using in an efficient way.

While the disclosure has been described by way of example(s) and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A test element group located at a scribe line of a wafer, the test element group comprising:

a first probe pad;

at least one second probe pad;

at least one third probe pad; the first probe pad, the at least one second probe pad, and the at least one third probe pad sequentially aligned;

at least one upper row contacting region located between the at least one second probe pad and the at least one third probe pad; and at least one lower row contacting region opposite to the at least one upper row contacting region, the at least one lower row contacting region located between the at least one second probe pad and the at least one third probe pad, wherein in a top view, the at least one upper row contacting region is separated from the at least one lower row contacting region;

wherein when the at least one upper row contacting region is electrically connected to the first probe pad, the at least one second probe pad, and the at least one third probe pad, the at least one lower row contacting region is insulated from the first probe pad, the at least one second probe pad, and the at least one third probe pad; or wherein when the at least one lower row contacting region is electrically connected to the first probe pad, the at least one second probe pad, and the at least one third probe pad, the at least one upper row contacting region is insulated from the first probe pad, the at least one second probe pad, and the at least one third probe pad.

2. The test element group of claim 1, wherein the at least one upper row contacting region comprises three of a plurality of vias corresponding to the first probe pad, the at least one second probe pad, and the at least one third probe pad, respectively.

3. The test element group of claim 2, wherein when the at least one upper row contacting region is electrically connected to the first probe pad, the at least one second probe pad, and the at least one third probe pad, the three of the plurality of vias electrically connected to the first probe pad, the at least one second probe pad, and the at least one third probe pad, respectively.

4. The test element group of claim 1, wherein the at least one lower row contacting region comprises three of a plurality of vias corresponding to the first probe pad, the at least one second probe pad, and the at least one third probe pad, respectively.

5. The test element group of claim 4, wherein when the at least one lower row contacting region is electrically connected to the first probe pad, the at least one second probe pad, and the at least one third probe pad, the three of the plurality of vias electrically connected to the first probe pad, the at least one second probe pad, and the at least one third probe pad, respectively.

6. The test element group of claim 1, wherein a number of the at least one second probe pad is two second probe pads;

a number of the at least one third probe pad is two third probe pads;

each one of the two second probe pads and each one of the two third probe pads are arranged interactively in sequence.

7. The test element group of claim 6, wherein a number of the at least one upper row contacting region is three upper row contacting regions; and a number of the at least one lower row contacting region is three lower row contacting regions;

wherein each one of the three upper row contacting regions is located between adjacent one of the two second probe pads and adjacent one of the two third probe pads, wherein each one of the three lower row contacting regions is located between adjacent one of the two second probe pads and adjacent one of the two third probe pads.

8. The test element group of claim 6, wherein the first probe pad is a gate probe pad, the at least one second probe pad is at least one drain probe pad, and the at least one third probe pad is at least one source probe pad.

9. The test element group of claim 1, wherein a width of the test element group is less than or equal to a width of scribe line being from 50 μm to 60 μm.

10. The test element group of claim 1, wherein the test element group further comprises:

a substrate;

a plurality of metal layers over the substrate;

a top layer over the plurality of metal layers, and the top layer comprising the first probe pad, the at least one second probe pad, and the at least one third probe pad; and a plurality of vias connected to at least one of the plurality of metal layers;

wherein the at least one upper row contacting region comprises three of the plurality of vias corresponding to the first probe pad, the at least one second probe pad, and the at least one third probe pad, respectively.

11. The test element group of claim 10, wherein the at least one lower row contacting region comprises three of the plurality of vias corresponding to the first probe pad, the at least one second probe pad, and the at least one third probe pad, respectively.

12. The test element group of claim 10, wherein the plurality of metal layers comprises an active layer and a gate electrode layer over the active layer;

wherein the wafer further comprises an insulating layer disposed between the active layer and the gate electrode layer.

13. A method of using a test element group, comprising:

sequentially aligning a first probe pad, at least one second probe pad, and at least one third probe pad;

providing at least one upper row contacting region and at least one lower row contacting region, the at least one upper row contacting region located between the at least one second probe pad and the at least one third probe pad; and the at least one lower row contacting region opposite to the at least one upper row contacting region, the at least one lower row contacting region located between the at least one second probe pad and the at least one third probe pad, wherein in a top view, the at least one upper row contacting region is separated from the at least one lower row contacting region;

providing a first photomask to form three of a plurality of vias in the at least one upper row contacting region and the three of the plurality of vias electrically connected to the first probe pad, the at least one second probe pad, and the at least one third probe pad, respectively; and detecting an upper chip through contacting the three of the plurality of vias in the at least one upper row contacting region, the first probe pad, the at least one second probe pad, and the at least one third probe pad by a test device.

14. The method of claim 13, further comprising:

providing a second photomask to seal the three of the plurality of vias in the at least one upper row contacting region, and to form three of a plurality of vias in the at least one lower row contacting region and the three of the plurality of vias electrically connected to the first probe pad, the at least one second probe pad, and the at least one third probe pad, respectively; and detecting a lower chip through contacting the three of the plurality of vias in the at least one lower row contacting region, the first probe pad, the at least one second probe pad, and the at least one third probe pad by the test device.

15. The method of claim 13, wherein the first probe pad is a gate probe pad, the at least one second probe pad is at least one drain probe pad, and the at least one third probe pad is at least one source probe pad.

* * * * *